(12) United States Patent
Narita et al.

(10) Patent No.: US 11,887,875 B2
(45) Date of Patent: Jan. 30, 2024

(54) SUBSTRATE STORING CONTAINER

(71) Applicant: MIRAIAL CO., LTD., Tokyo (JP)

(72) Inventors: Yuya Narita, Tokyo (JP); Tadatoshi Inoue, Tokyo (JP)

(73) Assignee: MIRAIAL CO., LTD., Tokyo (JP)

( * ) Notice: Subject to any disclaimer, the term of this patent is extended or adjusted under 35 U.S.C. 154(b) by 603 days.

(21) Appl. No.: 16/981,644

(22) PCT Filed: Nov. 28, 2018

(86) PCT No.: PCT/JP2018/043857
§ 371 (c)(1),
(2) Date: Jan. 5, 2021

(87) PCT Pub. No.: WO2020/066039
PCT Pub. Date: Apr. 2, 2020

(65) Prior Publication Data
US 2021/0111048 A1    Apr. 15, 2021

(51) Int. Cl.
*H01L 21/67* (2006.01)
*H01L 21/673* (2006.01)
*H01L 21/677* (2006.01)

(52) U.S. Cl.
CPC .. *H01L 21/67376* (2013.01); *H01L 21/67126* (2013.01); *H01L 21/67386* (2013.01); *H01L 21/67769* (2013.01)

(58) Field of Classification Search
CPC ......... H01L 21/67393; H01L 21/67017; H01L 21/67769; H01L 21/6735; H01L 21/6773; H01L 21/67326; H01L 21/673; H01L 85/30
USPC .......................... 206/710, 701, 711; 220/202
See application file for complete search history.

(56) References Cited

U.S. PATENT DOCUMENTS

| | | | |
|---|---|---|---|
| 10,475,682 B2 * | 11/2019 | Fuller | H01L 21/67383 |
| 11,075,099 B2 * | 7/2021 | Ogawa | H01L 21/67389 |
| 2005/0077204 A1 | 4/2005 | Sumi et al. | |
| 2005/0252827 A1 | 11/2005 | Tieben et al. | |
| 2009/0266441 A1 * | 10/2009 | Sato | F16K 15/063 141/98 |
| 2015/0294889 A1 | 10/2015 | Smith et al. | |

(Continued)

FOREIGN PATENT DOCUMENTS

| | | | |
|---|---|---|---|
| JP | 2004179449 A | 6/2004 |
| JP | 2008066330 A | 3/2008 |
| JP | 4204302 B | 1/2009 |

(Continued)

*Primary Examiner* — King M Chu
(74) *Attorney, Agent, or Firm* — MUNCY, GEISSLER, OLDS & LOWE, P.C.

(57) ABSTRACT

A substrate storing container includes: a container main body; a lid body that is attachable to and detachable from a container main body opening portion and can close the container main body opening portion; and a sealing member that closes the container main body opening portion together with the lid body, in which airtightness of the substrate storing space is enhanced so that 50% or more of a gas supplied to a substrate storing space can be discharged from an exhaust filter portion in a case in which a supply amount of a gas supplied from an outer space of the container main body to the substrate storing space through a gas supply filter portion is 22 liters per minute or less.

12 Claims, 12 Drawing Sheets

(56) References Cited

U.S. PATENT DOCUMENTS

2016/0351427 A1 12/2016 Murata et al.
2018/0074031 A1 3/2018 Abe et al.

FOREIGN PATENT DOCUMENTS

| JP | 5213440 B2 | 6/2013 |
| JP | 6293771 B2 | 3/2018 |
| JP | 2018041925 A | 3/2018 |
| WO | WO-2005/102872 A2 | 11/2005 |
| WO | WO-2014/081825 A1 | 5/2014 |
| WO | WO-2015/118782 A1 | 8/2015 |

* cited by examiner

FIG. 3
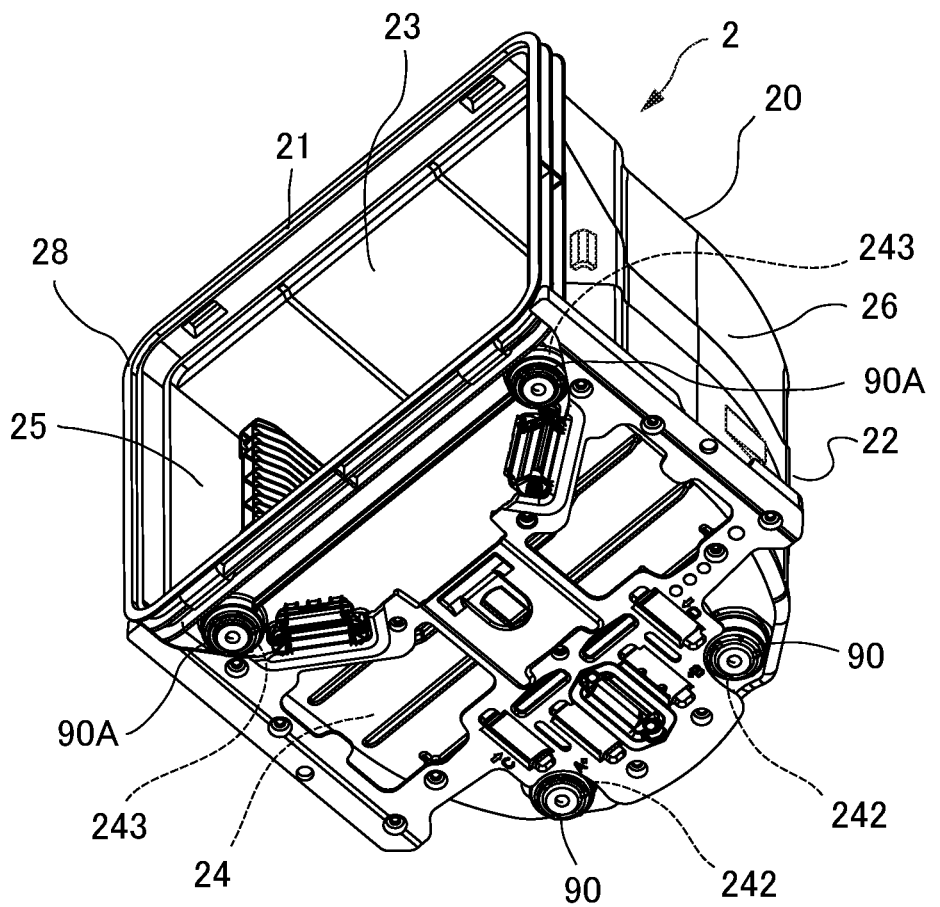
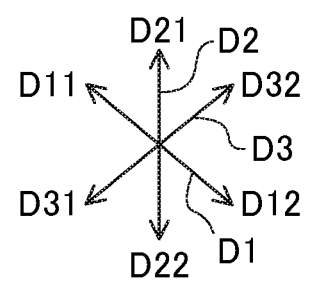

SUBSTRATE STORING CONTAINER

TECHNICAL FIELD

The present invention relates to a substrate storing container used, for example, when housing, storing, delivering, and transporting a substrate made from a semiconductor wafer, for example.

BACKGROUND ART

As a substrate storing container for storing a substrate made from a semiconductor wafer and delivering such a substrate in the process in a factory, a substrate storing container has been conventionally known that has a configuration including a container main body and a lid body (for example, refer to Japanese Patent No. 5213440, Japanese Patent No. 4204302, and Japanese Patent No. 6293771.

One end of the container main body has an opening circumferential portion at which a container main body opening portion is formed. The other end of the container main body has a closed tubular wall portion. A substrate storing space is formed in the container main body. The substrate storing space is formed by being surrounded by the wall portion, and can store a plurality of substrates. The lid body is attachable to and detachable from the opening circumferential portion, and can close the container main body opening portion. A side substrate support portion is provided at the wall portion so as to form a pair in the substrate storing space. While the container main body opening portion is not closed by the lid body, the side substrate support portion can support edge portions of the plurality of substrates in a state in which the adjacent substrates are spaced apart by a predetermined interval and arranged in parallel to each other.

A front retainer is provided at a portion of the lid body which faces the substrate storing space while the container main body opening portion is closed. While the container main body opening portion is closed by the lid body, the front retainer can support the edges of the plurality of substrates. Furthermore, a back side substrate support portion is provided at the wall portion so as to form a pair with the front retainer. The back side substrate support portion can support the edges of the plurality of substrates. While the container main body opening portion is closed by the lid body, the back side substrate support portion cooperates with the front retainer to support the plurality of substrates, thereby supporting the plurality of substrates in a state in which the adjacent substrates are spaced apart by a predetermined interval and are arranged in parallel with each other.

Patent Document 1: Japanese Patent No. 5213440
Patent Document 2: Japanese Patent No. 4204302
Patent Document 3: Japanese Patent No. 6293771

DISCLOSURE OF THE INVENTION

Problems to be Solved by the Invention

In a conventional substrate storing container, a ventilation passage is formed which can communicate between a substrate storing space and an outer space of the container main body. An inert gas such as nitrogen or dry air (hereinafter, referred to as a purge gas) from which moisture is removed (1% or less) flows in from the outside of the container main body to the substrate storing space through the ventilation passage, and gas purge is conducted.

More specifically, a gas supply hole and an exhaust hole as a ventilation passage are generally formed in the substrate storing container. Furthermore, the gas supply hole and the exhaust hole each include a check valve for the purpose of keeping the purge gas in the container for a long time. The injection of the purge gas into the substrate storing container is conducted during processing or being stored in a stocker.

However, in a practical sense, the amount of the purge gas discharged from the exhaust hole is small due to resistance of a film provided for the check valve of the exhaust hole, resistance until the release of the check valve, resistance of an exhaust flow passage as a ventilation passage in communication with the exhaust hole, and the like. In a case in which the exhaust is not conducted normally in connection with the injection of the purge gas, the purge gas may leak from a gasket portion as a sealing member attached to the lid body, thereby causing facility contamination or harm to humans.

It is an object of the present invention to provide a substrate storing container that makes it possible to reliably conduct exhaust in connection with the injection of a gas in a substrate storing space.

Means for Solving the Problems

A first aspect of the present invention relates to a substrate storing container including: a container main body including a substrate storing space formed therein which can store a plurality of substrates, and including an opening circumferential portion at one end thereof at which a container main body opening portion in communication with the substrate storing space is formed; a lid body that is attachable to and detachable from the opening circumferential portion and can close the container main body opening portion in a positional relationship being surrounded by the opening circumferential portion; a sealing member that is attached to the lid body, can abut the lid body and the opening circumferential portion, and intervenes between the opening circumferential portion and the lid body to adhere to and abut the opening circumferential portion and the lid body, thereby closing the container main body opening portion together with the lid body; and a filter portion including a ventilation passage that allows the substrate storing space and an outer space of the container main body to be in communication with each other, a filter disposed in the ventilation passage, and a filter portion housing forming the ventilation passage, wherein the filter portion is disposed at the container main body, and allows a gas to pass between the outer space of the container main body and the substrate storing space through the filter; in which the filter portion includes an exhaust filter portion that allows a gas to flow from the substrate storing space to the outer space of the container main body, and a gas supply filter portion that allows a gas to flow from the outer space of the container main body to the substrate storing space, and in which airtightness of the substrate storing space is enhanced so that 50% or more of a gas supplied to the substrate storing space can be discharged from the exhaust filter portion in a case in which a supply amount of a gas supplied from the outer space of the container main body to the substrate storing space through the gas supply filter portion is 22 liters per minute or less.

Furthermore, it is preferred that the sealing member seals the opening circumferential portion and the lid body so that a positive pressure in a container in the substrate storing space is 0.15 kpa or more when the gas is supplied from the outer space of the container main body to the substrate storing space through the gas supply filter portion.

Furthermore, it is preferred that the exhaust filter portion includes a valve body and a spring, the valve body switching between communication and blocking of the ventilation passage for exhaust which allows the gas to flow from the substrate storing space to the outer space of the container main body, the spring biasing the valve body in a direction blocking the ventilation passage for exhaust, and a spring constant of the spring is 0.05 kgf/mm or less.

Furthermore, it is preferred that the filter is provided in the ventilation passage for exhaust that allows the gas to flow from the substrate storing space to the outer space of the container main body, and partitions the ventilation passage into an upstream side and a downstream side, and an exhaust filter film total effective area that allows a gas to flow through the filter is 200 mm$^2$ or more.

A second aspect of the present invention relates to a substrate storing container including: a container main body including a substrate storing space formed therein which can store a plurality of substrates, and including an opening circumferential portion at one end thereof at which a container main body opening portion in communication with the substrate storing space is formed; a lid body that is attachable to and detachable from the opening circumferential portion and can close the container main body opening portion in a positional relationship being surrounded by the opening circumferential portion; a sealing member that is attached to the lid body, can abut the lid body and the opening circumferential portion, and intervenes between the opening circumferential portion and the lid body to adhere to and abut the opening circumferential portion and the lid body, thereby closing the container main body opening portion together with the lid body; and a filter portion including a ventilation passage that allows the substrate storing space and an outer space of the container main body to be in communication with each other, a filter disposed in the ventilation passage, and a filter portion housing forming the ventilation passage, in which the filter portion is disposed at the container main body, and allows a gas to pass between the outer space of the container main body and the substrate storing space through the filter; in which the filter portion includes an exhaust filter portion that allows a gas to flow from the substrate storing space to the outer space of the container main body, and a gas supply filter portion that allows a gas to flow from the outer space of the container main body to the substrate storing space, and in which the filter has a flow rate performance of 15 seconds or less according to an IPA flow method that measures a time required for 500 mL of IPA to pass through a sample having an exhaust filter film total effective area of 13.8 cm2 under a pressure of 98 kPa using a pressurized filtering device, so that 50% or more of a gas supplied to the substrate storing space can be discharged from the exhaust filter portion in a case in which a supply amount of a gas supplied from the outer space of the container main body to the substrate storing space through the gas supply filter portion is 22 liters per minute or less.

Furthermore, it is preferred that the filter is provided in the ventilation passage for exhaust that allows the gas to flow from the substrate storing space to the outer space of the container main body, and partitions the ventilation passage into an upstream side and a downstream side, and an exhaust filter film total effective area that allows a gas to flow through the filter is 200 mm$^2$ or more.

Furthermore, a third aspect of the present invention relates to a substrate storing container including: a container main body including a substrate storing space formed therein which can store a plurality of substrates, and including an opening circumferential portion at one end thereof at which a container main body opening portion in communication with the substrate storing space is formed; a lid body that is attachable to and detachable from the opening circumferential portion and can close the container main body opening portion in a positional relationship being surrounded by the opening circumferential portion; a sealing member that is attached to the lid body, can abut the lid body and the opening circumferential portion, and intervenes between the opening circumferential portion and the lid body to adhere to and abut the opening circumferential portion and the lid body, thereby closing the container main body opening portion together with the lid body; and a filter portion including a ventilation passage that allows the substrate storing space and an outer space of the container main body to be in communication with each other, and a filter portion housing forming the ventilation passage, wherein the filter portion is disposed at the container main body, and allows a gas to pass between the outer space of the container main body and the substrate storing space; in which the filter portion includes an exhaust filter portion that allows a gas to flow from the substrate storing space to the outer space of the container main body, and a gas supply filter portion that allows a gas to flow from the outer space of the container main body to the substrate storing space, and in which the exhaust filter portion is higher than the gas supply filter portion in terms of a flow rate performance measured according to an IPA flow method that measures a time required for 500 mL of IPA to pass through a sample having an exhaust filter film total effective area of 13.8 cm2 under a pressure of 98 kPa using a pressurized filtering device, so that 50% or more of a gas supplied to the substrate storing space can be discharged from the exhaust filter portion in a case in which a supply amount of a gas supplied from the outer space of the container main body to the substrate storing space through the gas supply filter portion is 22 liters per minute or less.

Furthermore, it is preferred that the flow rate performance of the exhaust filter portion is five times the flow rate performance of the gas supply filter portion. Furthermore, it is preferred that the exhaust filter portion includes a check valve that allows a gas to flow only in a direction from the substrate storing space toward the outer space of the container main body.

Furthermore, it is preferred that the exhaust filter portion includes a filter disposed in the ventilation passage, the gas supply filter portion includes a filter disposed in the ventilation passage, and a flow rate performance of the filter of the exhaust filter portion is higher than a flow rate performance of the filter of the gas supply filter portion.

Furthermore, it is preferred that the filter is provided in the ventilation passage for exhaust that allows the gas to flow from the substrate storing space to the outer space of the container main body, and partitions the ventilation passage into an upstream side and a downstream side, and the exhaust filter portion is larger than the gas supply filter portion in terms of the exhaust filter film total effective area that allows a gas to flow through the filter.

Furthermore, it is preferred that a filter is not provided in the ventilation passage of the exhaust filter portion, and the gas supply filter portion includes a filter disposed in the ventilation passage. Furthermore, it is preferred that the gas supply filter portion includes a check valve that allows a gas to flow only in a direction from the outer space of the container main body toward the substrate storing space.

Effects of the Invention

According to the present invention, it is possible to provide a substrate storing container that makes it possible to reliably conduct exhaust in connection with the injection of a gas in a substrate storing space.

BRIEF DESCRIPTION OF THE DRAWINGS

FIG. 3 is a lower perspective view of the container main body 2 of the substrate storing container 1 according to an embodiment of the present invention;

PREFERRED MODE FOR CARRYING OUT THE INVENTION

Figure 1:
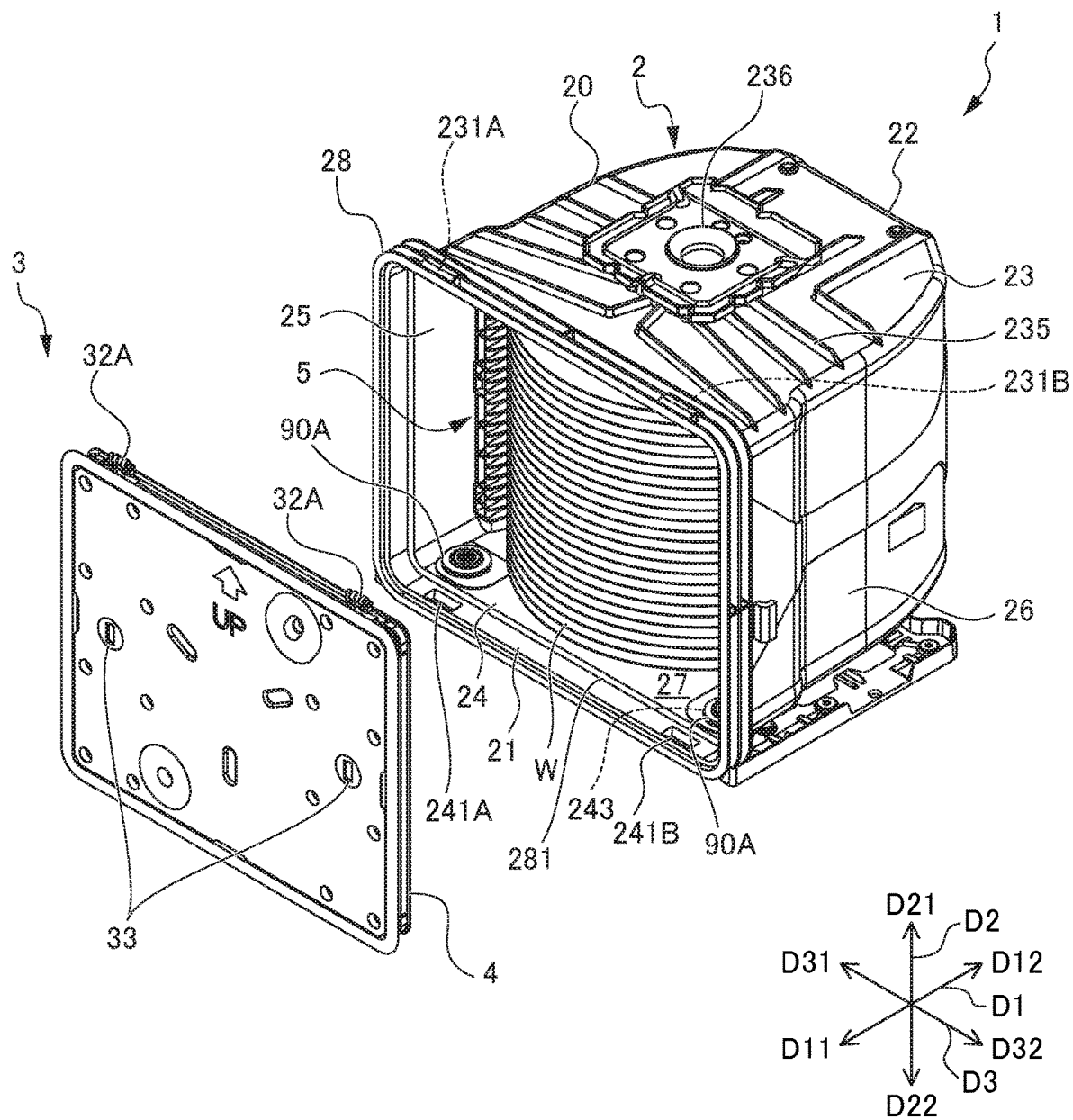
FIG. 1 is an exploded perspective view of a state in which a plurality of substrates W is stored in a substrate storing container 1 according to an embodiment of the present invention.
Figure 2:
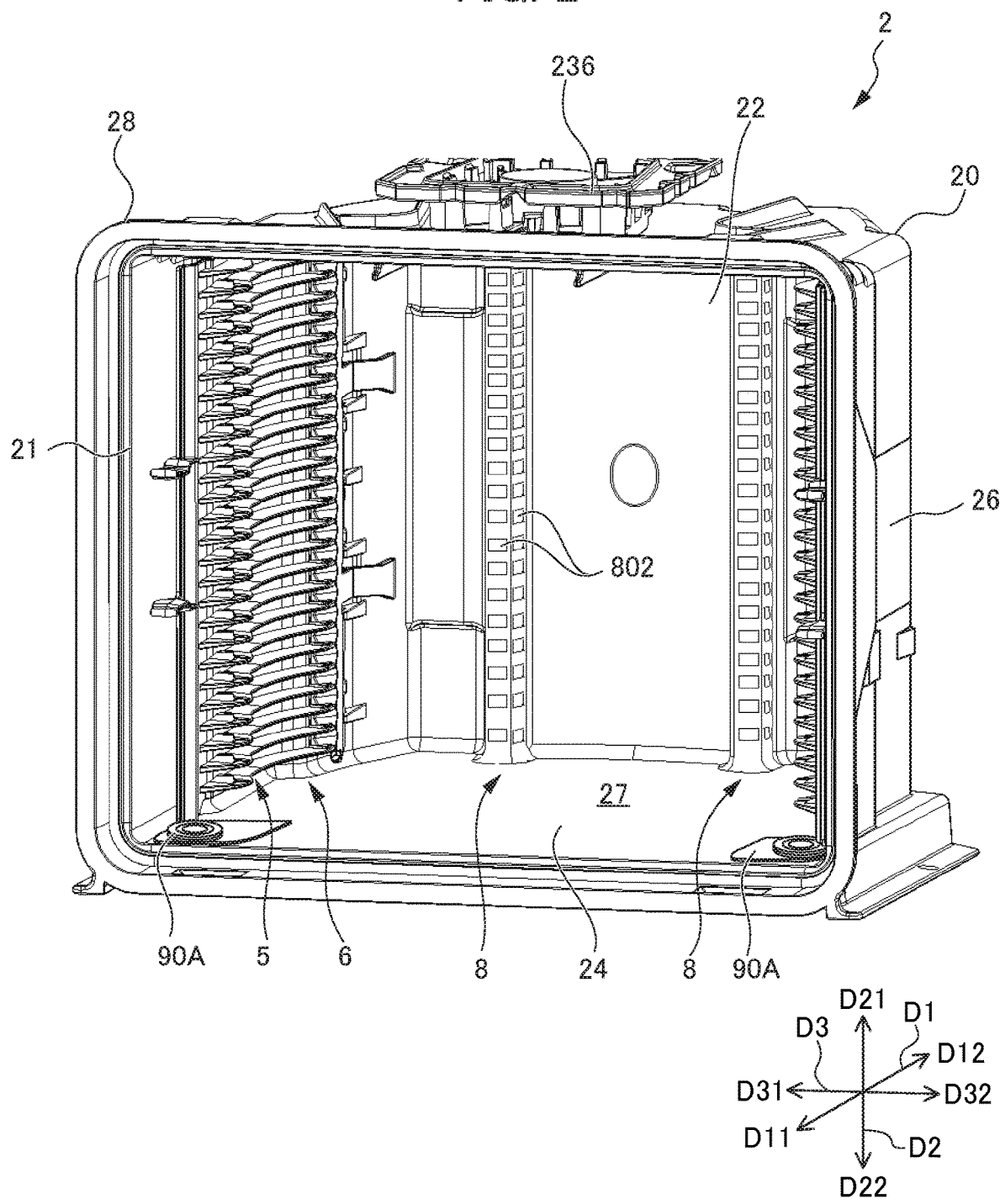
FIG. 2 is an upper perspective view of a container main body 2 of the substrate storing container 1 according to an embodiment of the present invention.
Figure 4:
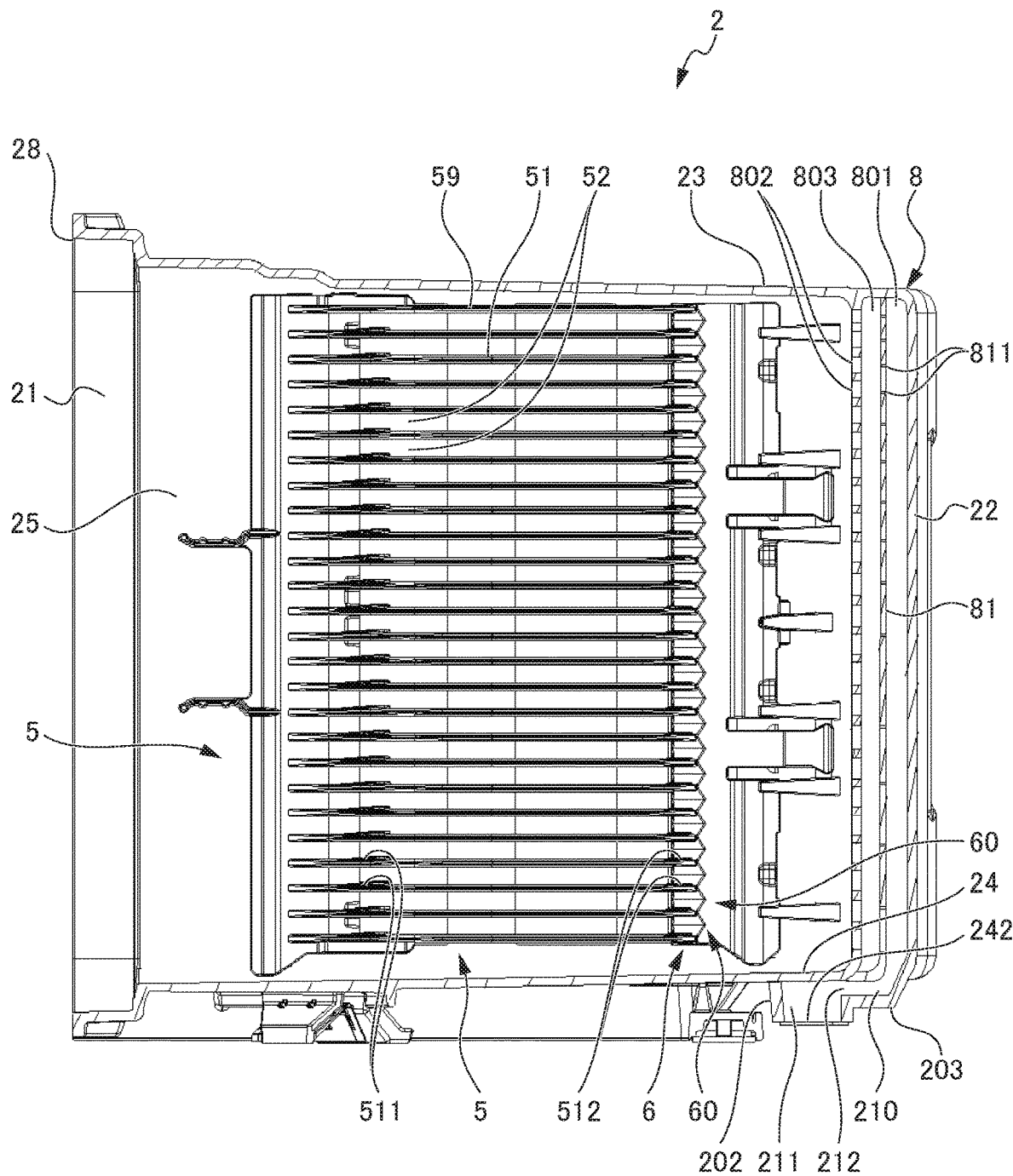
FIG. 4 is a lateral cross-sectional view of the container main body 2 of the substrate storing container 1 according to an embodiment of the present invention.

In the following, a substrate storing container 1 according to an embodiment will be described with reference to the drawings. FIG. 1 is an exploded perspective view of a state in which a plurality of substrates W is stored in the substrate storing container 1. FIG. 2 is an upper perspective view of a container main body 2 of the substrate storing container 1. FIG. 3 is a lower perspective view of the container main body 2 of the substrate storing container 1. FIG. 4 is a lateral cross-sectional view of the container main body 2 of the substrate storing container 1. It should be noted that, in FIG. 4, illustration of a gas supply filter portion 90, a rib 235, and a top flange 236 is thus omitted for the purpose of convenience.

Herein, for the convenience of explanation, the direction from the container main body 2 toward the lid body 3 (the direction from upper right to lower left in FIG. 1) is defined as a forward direction D11, and the opposite direction to the direction D11 is defined as a backward direction D12. Furthermore, these directions are defined as a forward-backward direction D1. Furthermore, the direction from a lower wall 24 to an upper wall 23 described later (upper direction in FIG. 1) is defined as an upper direction D21, and the direction opposite to the direction D21 is defined as a lower direction D22. In addition, these directions are defined as an upper-lower direction D2. Furthermore, the direction from a second side wall 26 toward a first side wall 25 (described later) (the direction from lower right to upper left in FIG. 1) is defined as a left direction D31, and the direction opposite to the direction D31 is defined as a right direction D32. Furthermore, these directions are defined as a left-right direction D3. Arrows indicating these directions are illustrated in the main drawings.

Furthermore, the substrates W (refer to FIG. 1) stored in the substrate storing container 1 are each a disk-like silicon wafer, glass wafer, sapphire wafer, etc., and are each a thin member used in industry. The substrates W according to the present embodiment are each a silicon wafer having a diameter of 300 mm.

As illustrated in FIG. 1, the substrate storing container 1 is used as an in-process container that stores the substrates each made of a silicon wafer as described above, and delivers the substrates in the processes performed in a factory, or as a shipping container that stores and transports the substrates W by transportation such as land transportation, air transportation, and marine transportation. The substrate storing container 1 includes a container main body 2 and a lid body 3. The container main body 2 includes a substrate support plate-like portion 5 as a side substrate support portion and a back side substrate support portion 6 (refer to FIG. 2, etc.). The lid body 3 includes a front retainer (not illustrated) as a lid body side substrate support portion.

The container main body 2 has a tubular wall portion 20 with a container main body opening portion 21 formed at one end and the other end closed. A substrate storing space 27 is formed in the container main body 2. The substrate storing space 27 is formed to be surrounded by the wall portion 20. The substrate support plate-like portion 5 is provided at a part that is a part of the wall portion 20 forming the substrate storing space 27. As illustrated in FIG. 1, a plurality of substrates W can be stored in the substrate storing space 27.

The substrate support plate-like portion 5 is provided at the wall portion 20 so as to form a pair in the substrate storing space 27. While the container main body opening portion 21 is not closed by the lid body 3, the substrate support plate-like portion 5 abuts an edge portion of each of the plurality of substrates W, thereby making it possible to support the plurality of substrates W in a state in which adjacent substrates W are spaced apart by a predetermined interval and arranged in parallel to each other. The back side substrate support portion 6 is integrally molded with the substrate support plate-like portion 5 at the back side of the substrate support plate-like portion 5.

The back side substrate support portion 6 (refer to FIG. 2, etc.) is provided at the wall portion 20 so as to form a pair with a front retainer (not illustrated) within the substrate storing space 27. When the container main body opening portion 21 is closed by the lid body 3, the back side substrate support portion 6 abuts the edge portion of each of the plurality of substrates W, thereby making it possible to support rear portions of the edge portions of the plurality of substrates W.

The lid body 3 is attachable to and detachable from an opening circumferential portion 28 (FIG. 1, etc.) that forms the container main body opening portion 21. The lid body 3 is able to open and close the container main body opening portion 21. The front retainer (not illustrated) is a part of the lid body 3 and provided at a part facing a portion which faces the substrate storing space 27 when the container main body opening portion 21 is closed by the lid body 3. The front retainer (not illustrated) is arranged so as to form a pair with the back side substrate support portion 6 in the interior of the substrate storing space 27.

When the container main body opening portion 21 is closed by the lid body 3, the front retainer (not illustrated) abuts the edge portion of each of the plurality of substrates W, thereby making it possible to support front portions of the edge portions of the plurality of substrates W. When the container main body opening portion 21 is closed by the lid body 3, the front retainer (not illustrated) supports the plurality of substrates W in cooperation with the back side substrate support portion 6, thereby retaining the plurality of substrates W in a state in which adjacent substrates W are spaced apart by a predetermined interval and arranged in parallel to each other.

The substrate storing container 1 is configured by a resin such as a plastic material and, unless explanations are particularly provided, examples of the resin of the plastic material include thermoplastic resins such as polycarbonate, cycloolefin polymer, polyether imide, polyether ketone, polybutylene terephthalate, polyether ether ketone, and liquid crystal polymers, alloys thereof, and the like. In a case of imparting conductivity to the resin of these molding materials, conductive materials such as carbon fiber, carbon powder, carbon nanotubes, and conductive polymers are selectively added. Furthermore, it is possible to add glass fiber, carbon fiber, and the like to enhance the rigidity.

In the following, each component will be described in detail. As illustrated in FIG. 1, the wall portion 20 of the container main body 2 includes a back wall 22, an upper wall 23, a lower wall 24, a first side wall 25, and a second side wall 26. The back wall 22, the upper wall 23, the lower wall 24, the first side wall 25, and the second side wall 26 are configured from the abovementioned material and are configured to be integrally molded.

The first side wall 25 faces the second side wall 26. The upper wall 23 faces the lower wall 24. A rear end of the upper wall 23, a rear end of the lower wall 24, a rear end of the first side wall 25, and a rear end of the second side wall 26 are each connected to the back wall 22. A front end of the upper wall 23, a front end of the lower wall 24, a front end of the first side wall 25, and a front end of the second side wall 26 configure the opening circumferential portion 28 that forms the container main body opening portion 21 having a substantially rectangular shape.

The opening circumferential portion 28 is provided at one end of the container main body 2. The back wall 22 is located at the other end of the container main body 2. The profile of the container main body 2 formed by the outer faces of the wall portion 20 is a box shape. Inner faces of the wall portion 20, i.e. an inner face of the back wall 22, an inner face of the upper wall 23, an inner face of the lower wall 24, an inner face of the first side wall 25, and an inner face of the second side wall 26 form the substrate storing space 27 surrounded by them. The container main body opening portion 21 formed by the opening circumferential portion 28 is in communication with the substrate storing space 27 that is surrounded by the wall portion 20 and formed inside the container main body 2. The substrate storing space 27 can store a maximum of twenty-five of the substrates W.

As illustrated in FIG. 1, latch engaging recess portions 231A, 231B, 241A, and 241B are formed at portions of the upper wall 23 and the lower wall 24 which are portions in the proximity of the opening circumferential portion 28. The latch engaging recess portions 231A, 231B, 241A, and 241B are indented outwardly of the substrate storing space 27. The latch engaging recess portions 231A, 231B, 241A, and 241B are respectively formed, one by one, in the vicinity of both left and right ends of the upper wall 23 and the lower wall 24. The total amount thereof is four.

As illustrated in FIG. 1, ribs 235 are provided so as to be integrally molded with the upper wall 23 at an outer face of the upper wall 23. The ribs 235 enhance the rigidity of the container main body 2. Furthermore, a top flange 236 is fixed at a middle portion of the upper wall 23. The top flange 236 is a member corresponding to a portion of the substrate storing container 1 from which it is hung to be suspended, when suspending the substrate storing container 1 by AMHS (Automated Material Handling System), PGV (Person Guided Vehicle), etc.

As illustrated in FIG. 3, the two types of through holes of gas supply holes 242 and exhaust holes 243 (refer to FIG. 1) are formed as ventilation passages 210 (refer to FIG. 4) at the four corners of the lower wall 24. In the present embodiment, the through holes at the two locations of the front portion of the lower wall 24 are the exhaust holes 243 for discharging a gas inside the container main body 2, and the through holes at the two locations of the rear portion thereof are the gas supply holes 242 for supplying a gas inside of the container main body 2. Gas supply filter portions 90 are disposed at the respective through holes as the gas supply holes 242. Exhaust filter portions 90A are disposed at the respective through holes as the exhaust holes 243. Therefore, the gas flow passages inside the gas supply filter portion 90 and the exhaust filter portion 90A each constitute a portion of the ventilation passage 210 that is can communicate between the substrate storing space 27 and the outer space of the container main body 2. Furthermore, the gas supply filter portion 90 and the exhaust filter portion 90A are each disposed at the wall portion 20, and a gas can pass through the gas supply filter portion 90 and the exhaust filter portion 90A between the outer space of the container main body 2 and the substrate storing space 27.

The substrate support plate-like portion 5 is an interior component that is provided at each of the first side wall 25 and the second side wall 26, and disposed within the substrate storing space 27 so as to form a pair in the left-right direction D3. More specifically, as illustrated in FIG. 4, etc., for example, the substrate support plate-like portion 5 includes a plate portion 51 and a support wall 52 as a plate portion support portion. The plate portion 51 and the support wall 52 are configured to be integrally molded by a resin material. The plate portion 51 is supported by the support wall 52.

The plate portion 51 has a substantially plate-like arc shape. Twenty-five of the plate portions 51 are respectively provided at the first side wall 25 and the second side wall 26 in the upper-lower direction D2. The total number of the plate portions 51 is fifty. The adjacent plate portions 51 are arranged so as to be spaced apart in the upper-lower direction D2 at an interval of 10 mm to 12 mm in a parallel positional relationship. It should be noted that a plate-like member 59 in parallel with the plate portion 51 is further arranged above the plate portion 51 that is located at the top. The plate-like member 59 serves as a guide upon inserting for the substrate W that is located at the top to be inserted into the substrate storing space 27.

Furthermore, the twenty-five plate portions 51 provided at the first side wall 25 and the twenty-five plate portions 51 provided at the second side wall 26 have a positional relationship opposite each other in the left-right direction D3. Furthermore, the fifty plate portions 51 and the plate-like member 59, which is in parallel with the plate portions 51 and serves as a guide, have a positional relationship parallel to the inner face of the lower wall 24. Protruding portions 511 and 512 are provided at an upper face of the plate portion 51. The substrate W supported by the plate portion 51 is only in contact with projecting ends of the protruding portions 511 and 512, and does not contact with the face of the plate portion 51.

The support wall 52 has a plate-like shape extending in the upper-lower direction D2 and a substantially forward-backward direction D1. As illustrated in FIG. 4, the support wall 52 has a predetermined length in a longitudinal direction of the plate portion 51, and is connected to a side end edge of the plate portion 51. The plate-like support wall 52 is curved toward the substrate storing space 27 along an outer side end edge of the plate portion 51.

In other words, the twenty-five plate portions 51 provided at the first side wall 25 are connected to the support wall 52 provided close to the first side wall 25. Similarly, the twenty-five plate portions 51 provided at the second side wall 26 are connected to the support wall 52 provided close to the second side wall 26. The support wall 52 is fixed to each of the first side wall 25 and the second side wall 26.

With the substrate support plate-like portion 5 of such a configuration, it is possible to support the edge portions of the plurality of substrates W in a state in which the adjacent substrates W among the plurality of substrates W are arranged to be spaced apart at a predetermined interval in a parallel positional relationship.

As illustrated in FIG. 2, the back side substrate support portion 6 includes a back side end edge support portion 60. The back side end edge support portion 60 is configured to be integrally molded with the plate portion 51 and the support wall 52 at a rear end of the plate portion 51 of the substrate support plate-like portion 5. Therefore, the substrate support plate-like portion 5, as the side substrate support portion, and the back side substrate support portion 6 constitute one combined interior component that is fixed to the container main body 2 in the interior of the container main body 2. It should be noted that the back side substrate support portion 6 may be configured separately from the substrate support plate-like portion 5. In other words, the back side end edge support portion 60 may be configured separately from the plate portion 51 of the substrate support plate-like portion 5.

Specifically, the twenty-five back side end edge support portions 60 are provided so as to correspond to each of the substrates W that can be stored in the substrate storing space 27. The back side end edge support portion 60 arranged at the first side wall 25 and the second side wall 26 has a positional relationship forming a pair with the front retainer (not illustrated) in the forward-backward direction D1 as described later. The substrate W is stored in the substrate storing space 27, and the lid body 3 is closed, whereby the back side end edge support portion 60 sandwiches and supports the end edge of the edge of the substrate W.

As illustrated in FIG. 2, etc., the back wall 22 includes a protruding portion 8 as a gas injection nozzle portion. Two of the protruding portion 8 are provided so as to make a pair (i.e., two protruding portions), protrude in a rib shape toward the container main body opening portion 21, and extend in parallel from the upper end up to the lower end of the back wall 22. In other words, the protruding portion 8 has a hollow column-like shape. The inner space of the protruding portion 8 is split into a front side space and a rear side space by a partition wall 81.

Figure 5:
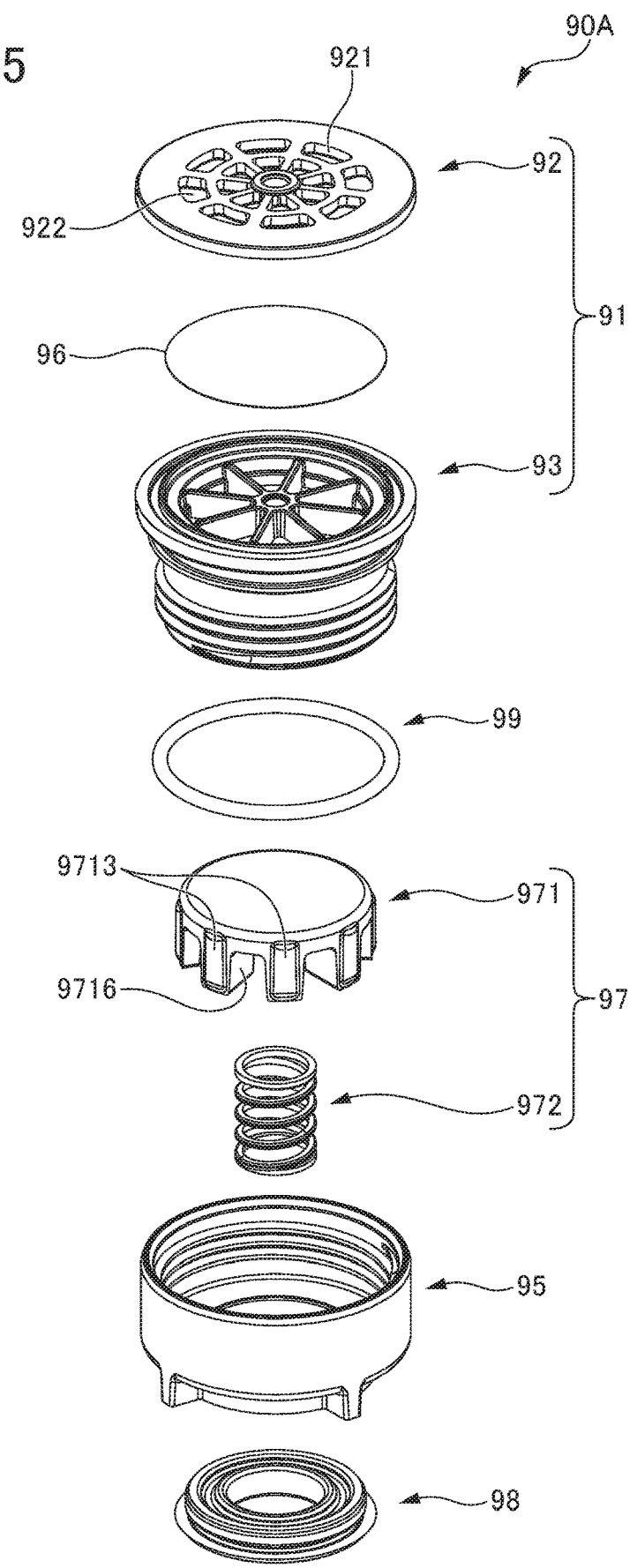
FIG. 5 is an above exploded perspective view of an exhaust filter portion 90A of the substrate storing container 1 according to an embodiment of the present invention.
Figure 6:
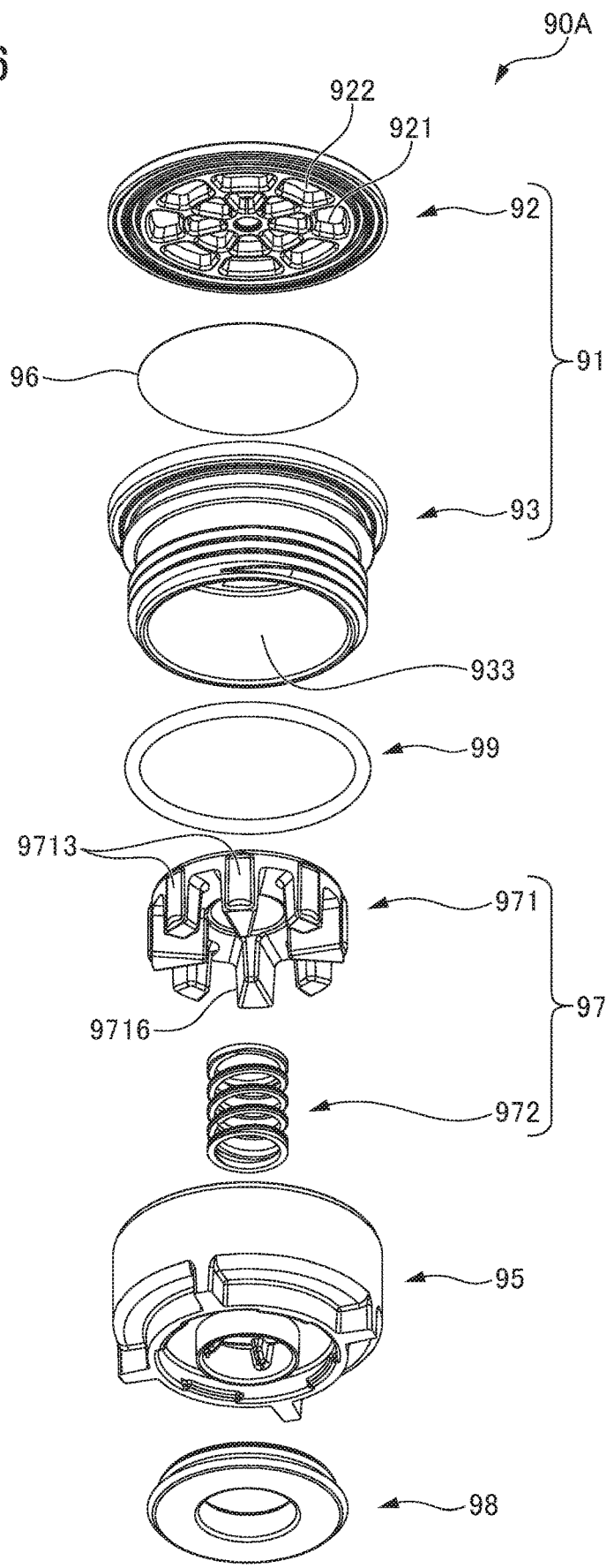
FIG. 6 is a below exploded perspective view of the exhaust filter portion 90A of the substrate storing container 1 according to an embodiment of the present invention.
Figure 7:
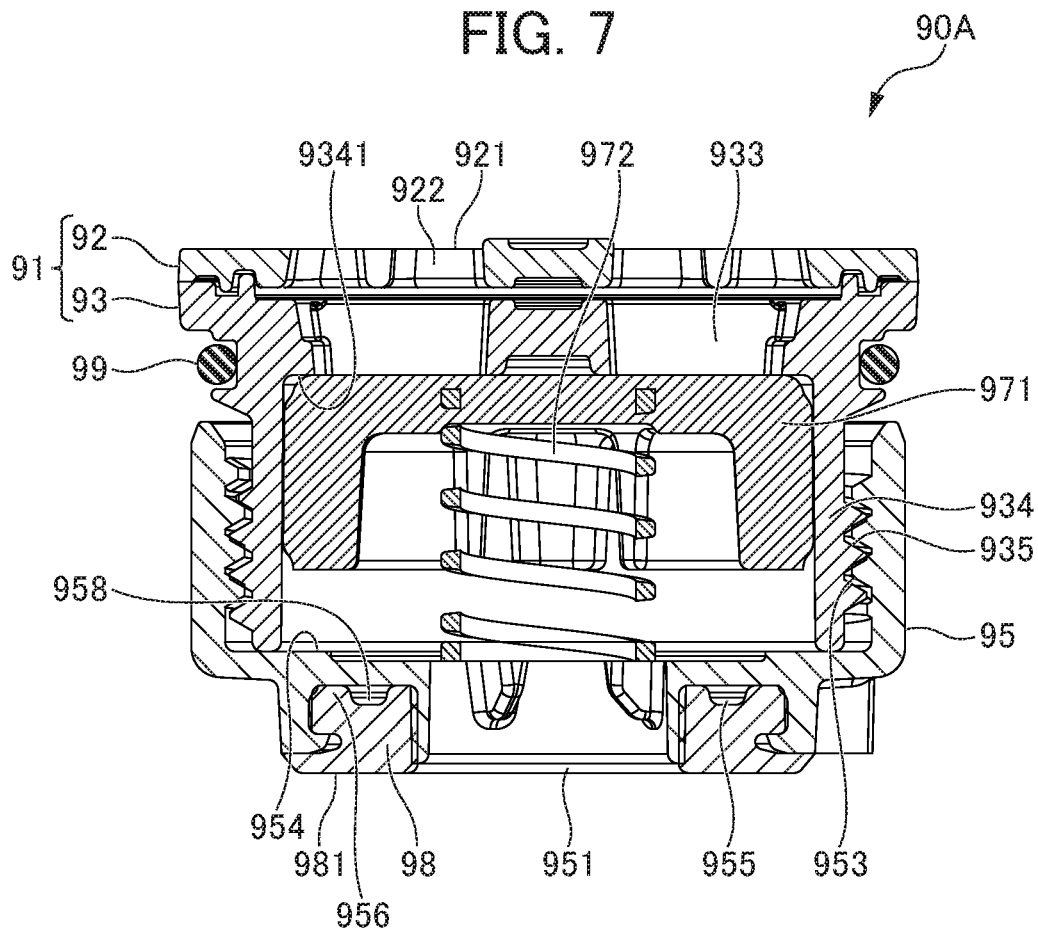
FIG. 7 is a cross-sectional view of the exhaust filter portion 90A of the substrate storing container 1 according to an embodiment of the present invention.

The front side space constitutes a gas pre-outflow retaining chamber 803, and the rear side space constitutes a gas standing chamber 801 that is in communication with the ventilation passage 210 (refer to FIG. 4, etc.) which can communicate between the substrate storing space 27 and the outer space of the container main body 2. FIG. 5 is an above exploded perspective view of the exhaust filter portion 90A of the substrate storing container 1. FIG. 6 is a below exploded perspective view of the exhaust filter portion 90A of the substrate storing container 1. FIG. 7 is a cross-sectional view of the exhaust filter portion 90A of the substrate storing container 1. The protruding portion 8 has a plurality of opening portions 802 that supply the gas flowing in the ventilation passage 210 into the substrate storing space 27. The gas standing chamber 801 constitutes a gas uniform retaining portion that can retain the gas from the ventilation passage 210 uniformly at a predetermined amount between the ventilation passage 210 and the opening portion 802 of the protruding portion 8 by the purge gas being temporarily retained and pressurized. In other words, the gas standing chamber 801 constitutes a gas uniform retaining portion that forms a gas amount uniformizing portion which can cause the purge gas to flow out at a uniformized flow amount from the plurality of the opening portions 802.

An inert gas such as nitrogen or dry air (hereinafter, referred to as purge gas) from which moisture was removed (1% or less) passes through the ventilation passage 210. As illustrated in FIG. 4, the ventilation passage 210 includes a gas inflow portion 211 and a horizontally extending portion 212, and a lower end of the gas standing chamber 801 is connected to the horizontally extending portion 212.

The gas inflow portion 211 is configured by an inner space of a cylindrical gas supply device connection portion 202 which is formed at the rear end of the lower wall 24 and protrudes in the lower direction D22 to form the gas supply hole 242. The horizontally extending portion 212 extends along the outer surface (the lower surface) of the lower wall 24 at the outside of the lower wall 24 from the upper end of the gas inflow portion 211 in the backward direction D12 (the right direction in FIG. 4), and is configured by the space between the outer surface of the lower wall 24 and a lower side flow passage forming portion 203 that protrudes below the lower wall 24. Furthermore, as described above, the gas standing chamber 801 connected to the horizontally extending portion 212 is configured by the rear side space of the protruding portion 8, and extends from the rear end of the horizontally extending portion 212 in the upper direction D21 up to the upper end of the back wall 22.

Small inflow openings 811 at which the purge gas flows in from the gas standing chamber 801 are formed at the partition wall 81. A plurality of inflow openings 811 is formed, and the total area of the inflow openings 811 is smaller than the total area of the opening portions 802.

The opening of the lower end of the gas supply device connection portion 202 constitutes the gas supply hole 242. The gas supply filter portion 90 is fixed at the gas supply device connection portion 202. The exhaust hole 243 is configured by the through hole of the lower wall 24, and the exhaust filter portion 90A is fixed at the through hole. In the exhaust filter portion 90A, the positional relationship in the vertical direction between a valve body 971 and a spring 972 (described later) of the gas supply filter portion 90 is reversed, and the positional relationship in the vertical direction of the posture of the valve body 971 is also reversed; however, the other configurations are common between the exhaust filter portion 90A and the gas supply filter portion 90. Therefore, in the following descriptions, only the exhaust filter portion 90A will be described, and the descriptions for the gas supply filter portion 90 will be omitted.

As illustrated in FIGS. 5 and 6, the exhaust filter portion 90A includes a filter housing 91, a filter ring 95, a ventilation film 96, a check valve member 97, an adhesion pad 98, and an O-ring 99. The filter housing 91 includes an upper first housing 92 and a lower first housing 93, and the ventilation film 96 is held between the upper first housing 92 and the lower first housing 93. The upper first housing 92 and the lower first housing 93 are welded by ultrasonic waves to be fixed.

The exhaust filter portion 90A is disposed at the lower wall 24 of the container main body 2 such that the upper first housing 92 is disposed on the side of the storing space 27. The exhaust filter portion 90A is not limited to a configuration being attached to the lower wall 24. The exhaust filter portion 90A may be attached to a wall portion or a lid body other than the lower wall 24, or alternatively, may be attached to both the lower wall and the lid body.

As illustrated in FIG. 5, storing space side openings 921 are formed in the upper first housing 92 disposed on the side of the storing space 27 of the exhaust filter portion 90A. As illustrated in FIG. 6, a storing space outer opening 951 is formed in the filter ring 95 on the side of the outer space of the storing container 1 of the exhaust filter portion 90A. These openings allow the inner space and the outer space of the storing container 1 to be in communication with each other via a ventilation space (an upper ventilation space 922 and a lower ventilation space 933) formed inside the exhaust filter portion 90A. The storing space outer opening 951 is configured to have a diameter much larger than that of the gas flow passage of a purge port that supplies a purge gas to a ventilation space (described later). With such a configuration, the total effective film area of the ventilation film 96 is ensured to be sufficiently large so as to be a predetermined value (described later), and the area of the upper surface of the valve body 971 (described later) on which a positive pressure in a container of the substrate storing space 27 is applied is configured to be large, thereby enabling the positive pressure in the container to be applied on the upper surface of the valve body 971 with a larger area.

With such a configuration, the exhaust filter portion 90A allows a gas to pass through the ventilation film 96 from the outer space of the container main body 2 in the direction toward the storing space 27 (hereinafter, defined as "inner direction of the storing space 27"), or from the storing space 27 in the direction toward the outer space of the container main body 2 (hereinafter, defined as "outer direction of the storing space 27"). During the gas passing through the ventilation film 96, the ventilation film 96 inhibits particles, etc. contained in the gas from passing therethrough, thereby filtering the gas.

According to the IPA flow method that measures the time required for 500 mL of IPA to pass through a sample having the exhaust filter film total effective area of 13.8 cm$^2$ under the pressure of 98 kPa using a pressurized filtering device, the ventilation film 96 has a flow rate performance of 15 seconds or less and, in the present embodiment, the ventilation film 96 has the flow rate performance of 4 seconds to 10 seconds. A case in which the flow rate performance exceeds 15 seconds indicates that a sufficient amount of a purge gas cannot be discharged from the exhaust filter portion 90A via the ventilation film 96. The upper ventilation space 922 and the storing space side openings 921 are formed in such a manner that the film effective total area that allows gas to flow and pass through the ventilation film 96 by the upper ventilation space 922 and the storing space side openings 921 is 200 mm$^2$ or more, and the film total effective area in the present embodiment is 450 mm$^2$. A case in which the film total effective area is less than 200 mm$^2$ indicates that a sufficient amount of a purge gas cannot be discharged from the exhaust filter portion 90A via the ventilation film 96.

As illustrated in FIG. 5, etc., the upper ventilation space 922 is provided which is in communication with the storing space side openings 921 at the upper first housing 92. A threaded portion 934 is formed at the lower first housing 93. The threaded portion 934 has a substantially circular cylindrical shape, and a thread 935 is formed on an outer circumferential surface of the threaded portion 934. The inner diameter of the threaded portion 934 becomes smaller at the upper end of the thread portion 934, which forms a step portion. A horizontal surface in this step portion which is an inner surface of the threaded portion 934 has an adhesion surface 9341 (refer to FIG. 7) configured by a flat surface. The lower ventilation space 933 that is connected to the lower first housing 93 and formed by the threaded portion 934 is formed in the lower first housing 93. Therefore, with the ventilation passage configured by the upper ventilation space 922 and the lower ventilation space 933, a ventilation space that is in communication between the storing space side openings 921 of the exhaust filter portion 90A (refer to FIG. 7) and the storing space outer opening 951 is formed.

The check valve member 97 is configured by the valve body 971 and the spring 972 for biasing the valve body 971 in a predetermined direction. The valve body 971 is disposed in the ventilation space inside the lower first housing 93 in the outer direction of the storing space 27. The spring 972 is disposed between the valve body 971 and the filter ring 95, and constitutes a compression spring that biases the valve body 971 against the filter ring 95 in the upper direction, i.e., in the inner direction of the storing space 27. The valve body 971 is openable and closable by the pressure of gas flowing through the ventilation passage. In other words, as illustrated in FIG. 5, etc., a plurality of valve body circumferential surface protruding portions 9713 are provided on the circumferential surface of the valve body 971 having a cylindrical shape and protrude in an outwardly radial direction of the valve body 971. The valve body circumferential surface protruding portions 9713 each have an arc shape in the circumferential direction of the valve body 971, and have a rectangular shape as seen in the lateral direction. The protruding end surface of the valve body circumferential surface protruding portion 9713 abuts the inner circumferential surface of the thread portion 934. A portion 9714 of the circumferential surface of the valve body 971 where the valve body circumferential surface protruding portions 9713 are not provided or a portion 9716 of the circumferential surface of the valve body 971 where a notch is formed does not abut the inner circumferential surface of the thread portion 934, and thus a ventilation passage is formed between these portions and the inner circumferential surface of the thread portion 934. The spring constant of the spring 972 is set such that, when the valve body 971 is pressed in the lower direction by a gas such as a purge gas flowing through the ventilation passage, the valve body 971 is spaced apart from the adhesion surface 9341 of the thread portion 934 so that the valve body 971 can be opened. When the pressing force of the gas is not applied to the valve body 971, the valve body 971 enters the closed state by the biasing force of the spring 972.

The spring constant of the spring 972 of the check valve member 97 is 0.05 kgf/mm or less, and the spring 972 is configured by molding a high-performance thermoplastic resin which has relatively high durability which includes at least one of polyetheretherketone, polycarbonate, and polyacetal. In the present embodiment, the spring constant of the spring 972 of the check valve member 97 is 0.005 kgf/mm, and the spring 972 is configured by molding polyetheretherketone. In a case in which the spring constant of the spring 972 of the check valve member 97 exceeds 0.05 kgf/mm, it is difficult for the valve body 971 of the check valve member 97 to be opened, and a sufficient amount of a purge gas cannot be discharged through the exhaust filter portion 90A.

The filter ring 95 has a substantially cylindrical shape in which the end in the outer direction of the storing space 27 has a smaller diameter. A thread 953 that is engaged with the thread 935 of the lower first housing 93 is provided on the inner diameter surface of the filter ring 95.

By screwing the filter ring 95 into the thread portion 934, the tip end (the lower end) of the thread portion 934 and a bottom surface 954 in the outer direction of the storing space 27 of the filter ring 95 abut and adhere with each other, a result of which airtightness of the ventilation passage formed inside the thread portion 934 is secured.

The tip end (the lower end in FIG. 5) in the outer direction of the storing space 27 of the filter ring 95 includes a groove 956 for attaching the adhesion pad 98. The adhesion pad 98 is formed in a circular shape having a co-axial positional relationship with the storing space outer opening 951, and the tip end (the bottommost end of the filter ring 95 in FIG. 7) in the outer direction of the storing space 27 of the filter ring 95 and the surface of the tip end (the bottommost surface of the adhesion pad 98 in FIG. 7) in the outer direction of the adhesion pad 98 have substantially the same positional relationship in the upper-lower direction. The tip end (the bottommost surface of the adhesion pad 98 in FIG. 7) in the outer direction of the storing space 27 of the adhesion pad 98 constitutes a sealing surface 981 that adheres to a purge port (a gas injection port) (described later). Furthermore, in the groove 956 in a state in which the adhesion pad 98 is attached thereto, a space 955 that constitutes the groove 956 is formed by a recessed portion 958 that is formed by a portion of the adhesion pad 98 being dented downwardly. The adhesion pad 98 prevents gas leakage between a purge port (not illustrated) and the sealing surface 981.

The exhaust filter portion 90A is fixed to the lower wall 24 via the O-ring 99 attached to the groove formed on the side surface of the lower first housing 93. When the exhaust filter portion 90A is fixed to the lower wall 24, the O-ring 99 is used between the exhaust filter portion 90A and the gas supply device connection portion 202 of the lower wall 24, whereby between the gas supply device connection portion 202 of the lower wall 24 and the lower first housing 93 are sealed.

For the material of the filter housing 91 and the filter ring 95, polycarbonate is used which has a lower outgas generation rate. Aside from polycarbonate for the material of the filter housing 91 and the filter ring 95, it suffices as long as it is a thermoplastic resin having a predetermined outgas generation rate or less. For example, a resin such as cycloolefin polymer, polyether imide, and polyetheretherketone can be used. Furthermore, for the material of the adhesion pad 98, polyolefin elastomer is used as an elastic member. Aside from polyolefin elastomer for the material of the adhesion pad 98, a resin such as polybutylene terephthalate and polyethylene, an elastomer such as polyethylene elastomer, or a rubber material such as silicone rubber and fluororubber can be used.

Figure 8:
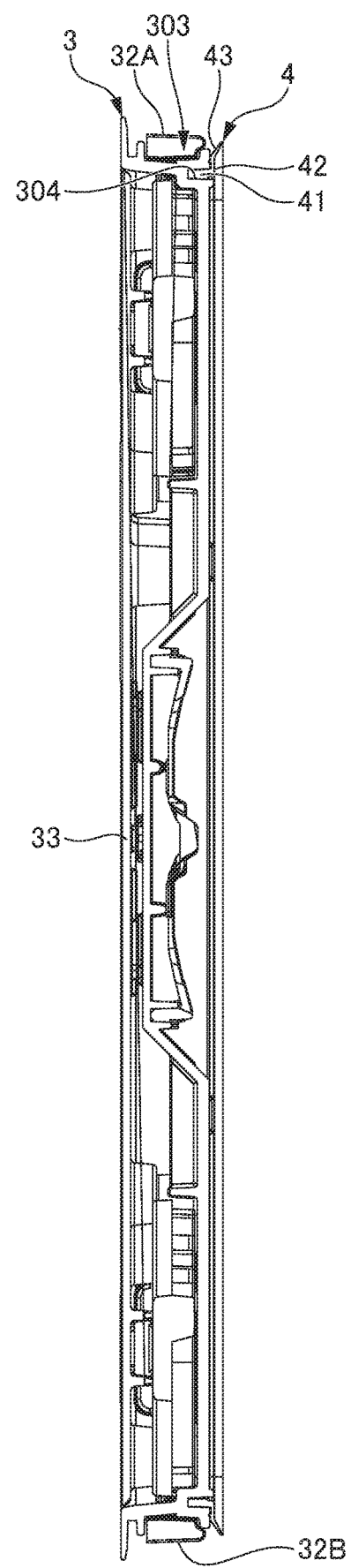
FIG. 8 is a cross-sectional view of a lid body 3 of the substrate storing container 1 according to an embodiment of the present invention.

FIG. 8 is a cross-sectional view of the lid body 3 of the substrate storing container 1. As illustrated in FIG. 1, etc., the lid body 3 has a substantially rectangular shape which substantially matches the shape of the opening circumferential portion 28 of the container main body 2. The lid body 3 is removably attached to the opening circumferential portion 28 of the container main body 2. By the lid body 3 being attached to the opening circumferential portion 28, the lid body 3 can close the container main body opening portion 21. A ring-like sealing member 4 is attached to a face which is an inner face (a face on the back side of the lid body 3 illustrated in FIG. 1) of the lid body 3 and faces a face of a step portion (a sealing face 281) formed at a location of the opening circumferential portion 28 in the backward direction D12, when the lid body 3 closes the container main body opening portion 21. The sealing member 4 is made from various types of thermoplastic elastomers which are polyester based, polyolefin based or the like and elastically deformable, fluorine containing rubber, silicon rubber, etc. The sealing member 4 is arranged so as to go around the circumferential edge portion of the lid body 3.

When the lid body 3 is attached to the opening circumferential portion 28, the sealing member 4 is held by the sealing face 281 and the inner face of the lid body 3 to be elastically deformed, whereby the lid body 3 closes the container main body opening portion 21 in a sealed state. When the lid body 3 is removed from the opening circumferential portion 28, it is possible to load or unload the substrates W relative to the substrate storing space 27 in the container main body 2.

Figure 9:
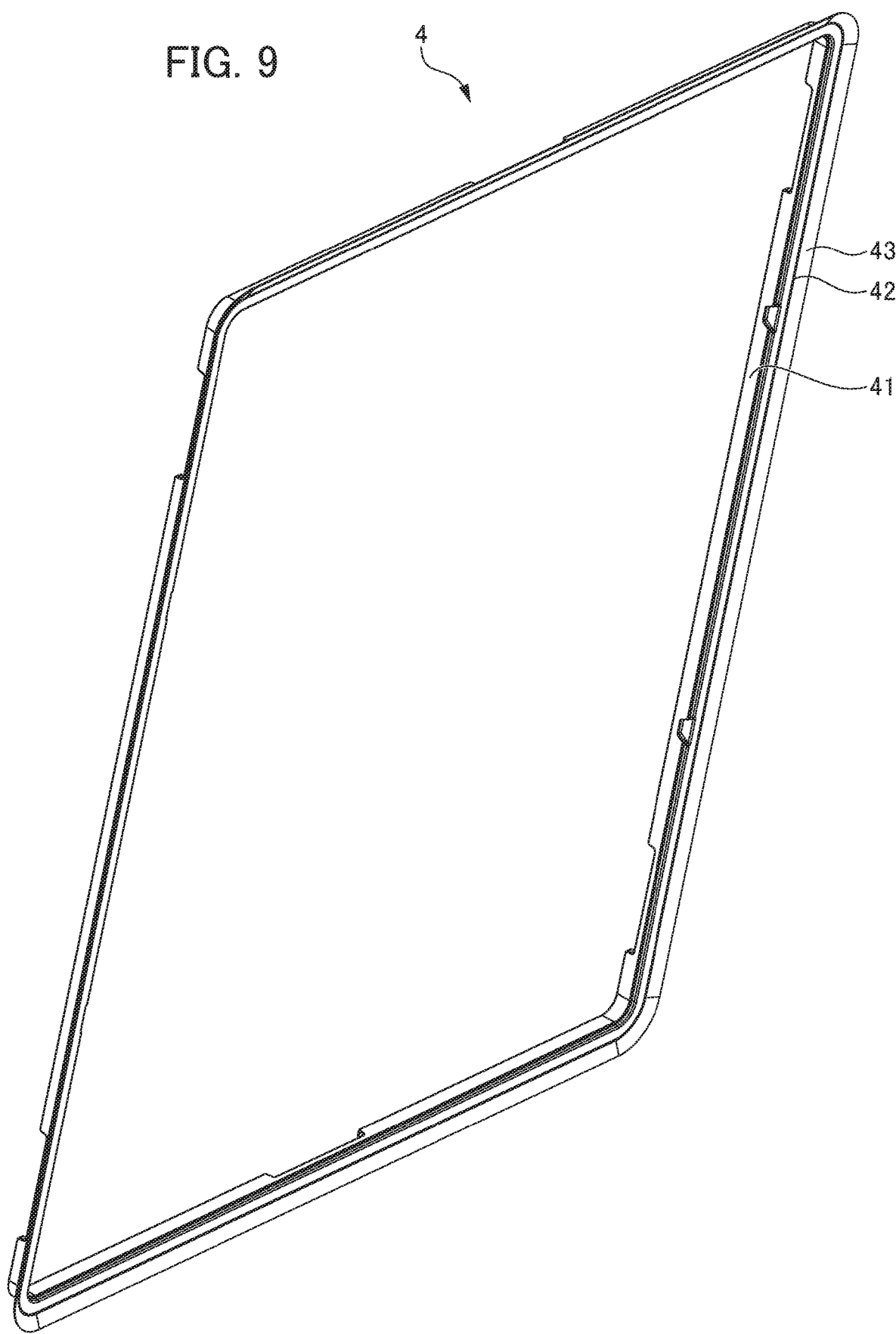
FIG. 9 is a perspective view of a sealing member 4 of the substrate storing container 1 according to an embodiment of the present invention.
Figure 10:
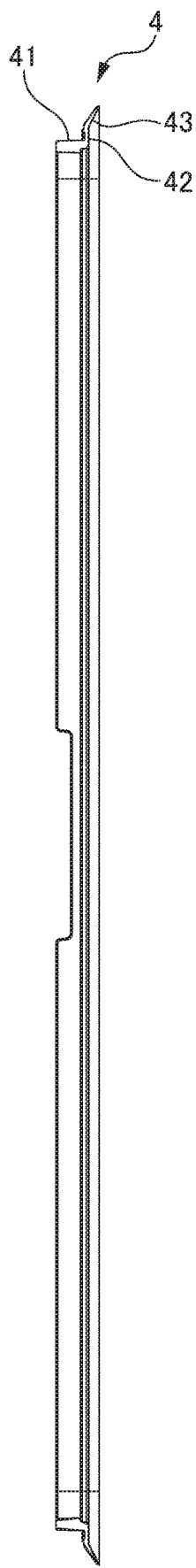
FIG. 10 is a lateral view of the sealing member 4 of the substrate storing container 1 according to an embodiment of the present invention.

FIG. 9 is a perspective view of the sealing member 4 of the substrate storing container 1. FIG. 10 is a lateral view of the sealing member 4 of the substrate storing container 1. More specifically, as illustrated in FIGS. 8 to 10, the sealing member 4 includes a base 41, a basal side portion 42, and a container abutting tip end portion 43. The base 41, the basal side portion 42, and the container abutting tip end portion 43 are integrally molded with fluororubber. The base 41 is fitted and fixed to a circular groove 304 of a sealing member attachment portion 303.

As illustrated in FIG. 8, the basal side portion 42 extends from the rear end (the right end in FIG. 8) of the base 41 in a direction from the center to a periphery 302 of the lid body 3 along an inner surface 301 of the lid body 3 in the cross section that is orthogonal to the circumferential direction of the lid body 3. An extending end of the basal side portion 42 is connected to the container abutting tip end portion 43. In other words, the basal side portion 42 couples the base 41 with the container abutting tip end portion 43, and the elastic deformation thereof allows the container abutting tip end portion 43 to swing with respect to the base 41 in the cross section that is orthogonal to the circumferential direction of the lid body 3.

As illustrated in FIG. 8, the container abutting tip end portion 43 extends in an inclined manner to go toward the rear direction (the right direction in FIG. 8) as approaching the outside of the lid body 3 from the end of the basal side portion 42. The length of the container abutting tip end portion 43 in the direction in which the container abutting tip end portion 43 extends is configured to be equal to the length of a container abutting tip end portion of a normal substrate storing container. Furthermore, the thickness of the basal side portion 42 and the container abutting tip end portion 43 is configured to be approximately double the thickness of a basal side portion of a normal substrate storing container and a normal container abutting tip end portion. With such a configuration, the sealing property by the sealing member 4 between the lid body 3 and the opening circumferential portion 28 is enhanced, and thus it is possible to inhibit a purge gas from leaking between the lid body 3 and the opening circumferential portion 28. As a result, owing to the high sealing property by the sealing member 4, when a purge gas is supplied to the substrate storing space 27, the positive pressure in a container of the substrate storing space 27 can be increased up to 0.15 kpa or more. In a case in which the positive pressure in the container of the substrate storing space 27 is less than 0.15 kpa, it is difficult for the valve body 971 of the check valve member 97 to be opened, and a sufficient amount of a purge gas cannot be discharged through the exhaust filter portion 90A.

A latching mechanism is provided at the lid body 3. The latching mechanism is provided in the vicinity of both left and right end portions of the lid body 3. As illustrated in FIG. 1, the latching mechanism includes two upper side latch portions 32A which can project from the upper side of the lid body 3 in the upper direction D21, and two lower side latch portions 32B that can project from the lower side of the lid body 3 in the lower direction D22. The two upper side latch portions 32A are arranged in the vicinity of both left and right ends of the upper side of the lid body 3, and the two lower side latch portions 32B are arranged in the vicinity of both left and right ends of the lower side of the lid body 3.

An operation portion 33 is provided at an outer face of the lid body 3. By operating the operation portion 33 from the front side of the lid body 3, it is possible to cause the upper side latch portions 32A and the lower side latch portions 32B to respectively project from the upper side and the lower side of the lid body 3, as well as possible to establish a state not projecting from the upper side and the lower side of the lid body 3. By the upper side latch portions 32A projecting from the upper side of the lid body 3 in the upper direction D21 to engage with the latch engaging recess portions 231A and 231B of the container main body 2 and the lower side latch portions 32B projecting from the lower side of the lid body 3 in the lower direction D22 to engage with the latch engaging recess portions 241A and 241B of the container main body 2, the lid body 3 is fixed to the opening circumferential portion 28 of the container main body 2.

On the inner side of the lid body 3, a recessed portion (not illustrated) that is indented outwardly of the substrate storing space 27 is formed. A front retainer (not illustrated) is fixedly provided at a portion of the recessed portion (not illustrated) and a portion of the lid body 3 outside the recessed portion 34.

The front retainer (not illustrated) includes front retainer substrate receiving portions (not illustrated). The front retainer substrate receiving portions (not illustrated) are arranged in pairs, each having two front retainer substrate receiving portions that are spaced apart at a predetermined interval in the left-right direction D3. The front retainer substrate receiving portions that are arranged in pairs, each having two front retainer substrate receiving portions, are provided in a state in which twenty-five pieces of the pairs are arranged in parallel in the upper-lower direction D2. When the substrates W are stored in the substrate storing space 27 and the space is closed by the lid body 3, the front retainer substrate receiving portion sandwiches and supports the substrates W.

In the substrate storing container 1 as described above, gas purge (gas replacement) using a purge gas is performed as follows. First, the gas supply filter portion 90 (refer to FIG. 3, etc.) disposed at the gas supply device connection portion 202 (refer to FIG. 4, etc.) is connected to a gas supply nozzle of a gas supply device (not illustrated) that supplies a purge gas as a gas. Next, the purge gas is supplied at the rate of 22 liters per minute or less from the gas supply nozzle of the gas supply device to the ventilation passage 210. With such a configuration, the purge gas flows through the gas inflow portion 211 and the horizontally extending portion 212 of the ventilation passage 210, flows inside of the gas standing chamber 801 from the lower end of the gas standing chamber 801, and flows forcefully toward the upper end of the gas standing chamber 801. Thereafter, when the purge gas is temporarily retained in the gas standing chamber 801 and the pressure increases, the purge gas subsequently flows in the gas pre-outflow retaining chamber 803 from the inflow opening 811 of the partition wall 81.

At this moment, since the inflow opening 811 is small, the purge gas flows in the gas pre-outflow retaining chamber 803 less forcefully. Thereafter, the purge gas is temporarily retained in the gas pre-outflow retaining chamber 803. Thereafter, the purge gas that is temporarily retained and pressurized in this way gradually flows out to the substrate storing space 27 from the opening portion 802. The positive pressure in the container of the substrate storing space 27 increases due to the purge gas that has flowed out to the substrate storing space 27.

Furthermore, at this moment, due to the high sealing property of the sealing member 4, by the purge gas that has flowed out to the substrate storing space 27 the positive pressure in the container of the substrate storing space 27 continues to increase up to 0.15 kpa or more. During the increase, the valve body 971 of the exhaust filter portion 90A is pressed downwardly by the biasing force of the spring 972 and opened, and discharging from the storing space outer opening 951 starts.

Furthermore, the spring constant of the spring 972 of the exhaust filter portion 90A is 0.05 kgf/mm or less, and in the present embodiment, the spring constant of the spring 972 of the check valve member 97 is 0.005 kgf/mm. Therefore, the purge gas can easily open the valve body 971, and flows out from the substrate storing space 27. Therefore, in a case in which the purge gas is supplied at the rate of 22 liters per minute or less, 50% or more of the purge gas supplied to the substrate storing space 27 is discharged from the exhaust filter portion 90A.

Figure 11:
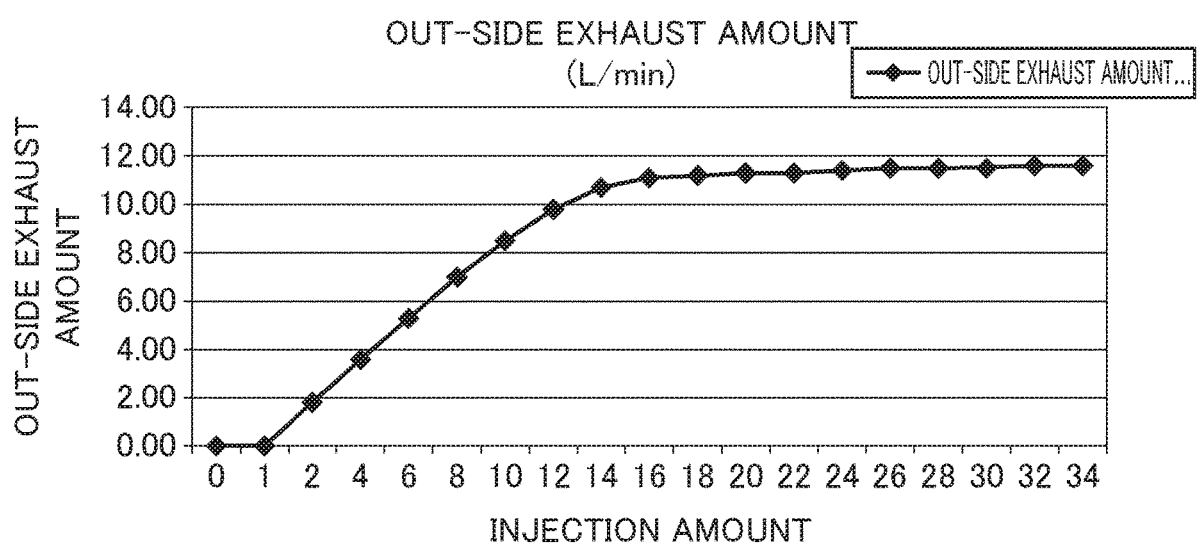
FIG. 11 is a graph showing a discharge amount of a purge gas discharged from the exhaust filter portion 90A in the substrate storing container 1 according to an embodiment of the present invention.
Figure 12:
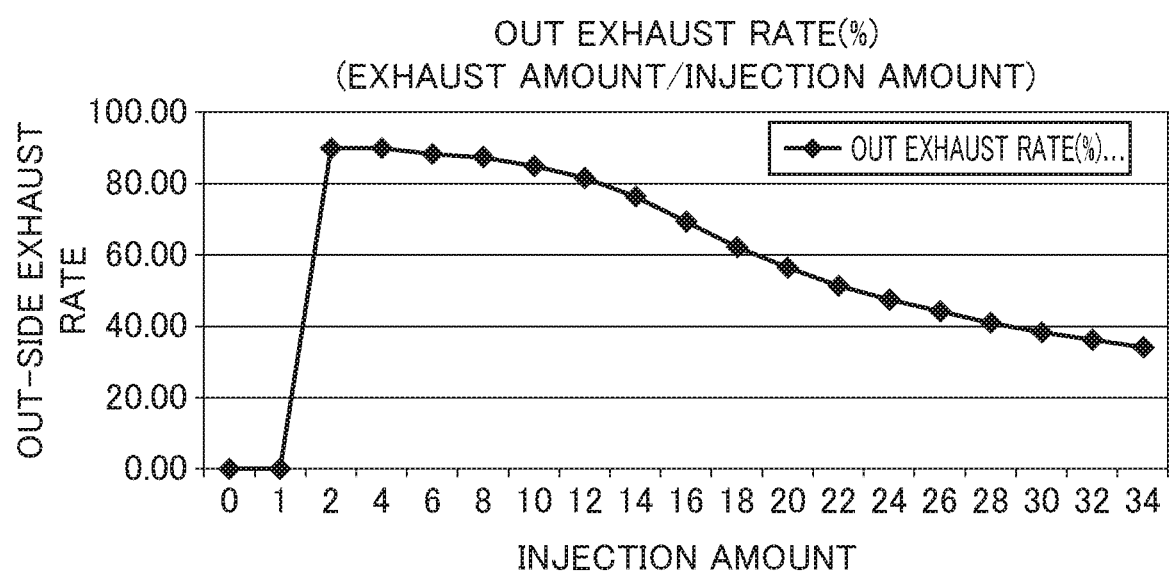
FIG. 12 is a graph showing a discharge rate which is a ratio of an injection amount of a purge gas aspirated from a gas supply filter portion 90 to an exhaust amount of a purge gas discharged from the exhaust filter portion 90A in the substrate storing container 1 according to one embodiment of the present invention.

Next, an experiment for checking the discharge amount from the exhaust filter portion 90A was carried out in a case in which the value of the amount of the purge gas supplied to the ventilation passage 210 from the gas supply nozzle of the gas supply device was changed variously by using the substrate storing container according to the present embodiment. Thereafter, the discharge amount was recorded, and a discharging rate which is a value of at what ratio with respect to an injection amount the discharging was carried out was recorded. The results of the experiment are shown in Table 1 and FIGS. 11 and 12. FIG. 11 is a graph showing the discharge amount of a purge gas discharged from the exhaust filter portion 90A in the substrate storing container 1. FIG. 12 is a graph showing the discharge rate which is a ratio of an injection amount of the purge gas aspirated from the gas supply filter portion 90 to an exhaust amount of the purge gas discharged from the exhaust filter portion 90A in the substrate storing container 1.

TABLE 1

| INJECTION AMOUNT (L/min) | PRESSURE IN CONTAINER (kPa) | OUT-SIDE EXHAUST AMOUNT (L/min) | OUT EXHAUST AMOUNT (%) (INJECTION AMOUNT/ EXHAUST AMOUNT) |
|---|---|---|---|
| 0 | 0.00 | 0.00 | 0.00 |
| 1 | 0.15 | 0.00 | 0.00 |
| 2 | 0.25 | 1.80 | 90.00 |
| 4 | 0.80 | 3.60 | 90.00 |
| 6 | 1.30 | 5.30 | 88.33 |
| 8 | 1.70 | 7.00 | 87.50 |
| 10 | 2.10 | 8.50 | 85.00 |
| 12 | 2.50 | 9.80 | 81.67 |
| 14 | 2.75 | 10.70 | 76.43 |
| 16 | 2.80 | 11.10 | 69.38 |
| 18 | 2.80 | 11.20 | 62.22 |
| 20 | 2.80 | 11.30 | 56.50 |
| 22 | 2.85 | 11.30 | 51.36 |
| 24 | 2.85 | 11.40 | 47.50 |
| 26 | 2.90 | 11.50 | 44.23 |
| 28 | 2.90 | 11.50 | 41.07 |
| 30 | 2.95 | 11.50 | 38.33 |
| 32 | 2.95 | 11.60 | 36.25 |
| 34 | 2.95 | 11.60 | 34.12 |
| 50 | 3.05 | 11.80 | 23.60 |

As shown in FIG. 11, as the injection amount of the purge gas increases, the discharge amount of the purge gas increases accordingly. However, the discharge amount is not in proportion with the injection amount, and the discharge amount does not substantially increase even though the injection amount increases from the amount around 22 liters per minute. Therefore, as shown in FIG. 12, in a case in which the injection amount is small, the discharge rate can take a value close to 90%; however, as the injection amount increases, the value of the discharge rate becomes relatively small. Furthermore, it is found that, when the injection amount exceeds 22 liters per minute, the discharge rate lowers 50%.

In this way, when the discharge rate becomes less than 50%, irrespective of the sealing performance of the sealing member 4 being high, the purge gas may leak between the lid body 3 and the container main body 2, thereby causing facility contamination or harm to humans. Therefore, it is found from the experiments that a substrate in which the discharge rate becomes 50% or more when the purge gas is supplied at the rate of 22 liters per minute to the ventilation passage 210 from the gas supply nozzle of the gas supply device is preferred in order to prevent the occurrence of facility contamination or harm to humans due to the leakage of the purge gas, and furthermore, it is possible to obtain a preferred discharge rate with respect to the supply amount of an actual purge gas.

According to the substrate storing container 1 related to the present embodiment with the above-described configuration, it is possible to obtain the following effects. As described above, the substrate storing container 1 includes: the container main body 2 including the opening circumferential portion 28 at one end thereof where the container main body opening portion 21 is formed, and including the tubular wall portion 20 having another end thereof which is closed, in which the substrate storing space 27 is formed which can store the plurality of substrates W by an inner face of the wall portion, and is in communication with the container main body opening portion 21; the lid body 3 that is attachable to and detachable from the container main body opening portion 21 and can close the container main body opening portion 21; the sealing member 4 that is attached to the lid body 3 can abut the lid body 3 and the opening circumferential portion 28, and intervenes between the opening circumferential portion 28 and the lid body 3 to adhere to and abut the opening circumferential portion 28 and the lid body 3, thereby closing the lid body 3 and the container main body opening portion 21; and the gas supply filter portion 90 and the exhaust filter portion 90A including the ventilation passage 210 that allows the substrate storing space 27 and the outer space of the container main body 2 to be in communication with each other, the ventilation film 96 which is a filter disposed in the ventilation passage 210, and the filter housing 91 forming the ventilation passage 210, in which the gas supply filter portion 90 and the exhaust filter portion 90A are disposed at the container main body 2, and allows a purge gas as a gas to pass between the outer space of the container main body 2 and the substrate storing space 27 through the ventilation film 96. The airtightness of the substrate storing space 27 is enhanced so that 50% or more of a gas supplied to the substrate storing space 27 can be discharged from the exhaust filter portion 90A in a case in which a supply amount of a gas supplied from the outer space of the container main body 2 to the substrate storing space 27 through the gas supply filter portion 90 is 22 liters per minute or less.

With the above-described configuration, it is possible to achieve 50% or more of the exhaust rate in a case in which the supply amount of the purge gas supplied to the substrate storing space 27 via the gas supply filter portion 90 is at the rate of 22 liters per minute or less. As a result, it is possible to inhibit the purge gas from leaking from the sealing member 4 attached to the lid body 3, and it is also possible to prevent facility contamination or harm to human from occurring.

Furthermore, the sealing member 4 seals the opening circumferential portion 28 and the lid body 3 so that a positive pressure in a container in the substrate storing space 27 is 0.15 kpa or more when the gas is supplied from the outer space of the container main body 2 to the substrate storing space 27 through the gas supply filter portion 90.

With such a configuration, since it is possible to set the positive pressure in the container in the substrate storing space 27 to be 0.15 kpa or more, which is an adequately high pressure, it becomes easy to open the valve body 971 of the exhaust filter portion 90A, and it is possible to secure the exhaust amount easily.

Furthermore, the exhaust filter portion 90A includes the valve body 971 and the spring 972. The valve body 971 switches between communication and blocking of the ventilation passage 210 for exhaust which allows the gas to flow from the substrate storing space 27 to the outer space of the container main body 2, and the spring 972 biases the valve body 971 in a direction blocking the ventilation passage 210 for exhaust. The spring constant of the spring 972 is 0.05 kgf/mm or less. With such a configuration, it becomes easy to open the valve body 971, and it is also possible to secure the exhaust amount easily.

Furthermore, the ventilation film 96 as a filter is provided in the ventilation passage for exhaust that allows the gas as a purge gas to flow from the substrate storing space 27 to the outer space of the container main body 2, and partitions the ventilation passage into an upstream side and a downstream side. The exhaust filter film total effective area that allows the gas to flow through the ventilation film 96 is 200 mm² or more. With such a configuration, it is possible to sufficiently secure the exhaust filter film total effective area, and it is also possible to secure the flow amount of the purge gas that passes through the ventilation film 96. As a result, it is possible to secure the exhaust amount easily.

Further, the ventilation film 96 serving as a filter has a flow rate performance of 15 seconds or less according to an IPA flow method that measures the time required for 500 mL of IPA to pass through a sample having an exhaust filter film total effective area of 13.8 cm$^2$ under a pressure of 98 kPa using a pressurized filtering device. With such a configuration, it is possible to secure sufficient flow rate performance, and it is also possible to secure the flow rate of the purge gas that passes through the ventilation film 96 of the exhaust filter portion 90A. As a result, it is possible to secure the exhaust amount easily.

The present invention is not limited to the abovementioned embodiments, and modifications thereto within the technical scope recited in the claims are possible.

For example, it may be configured such that 50% or more of a gas supplied to the substrate storing space can be discharged from the exhaust filter portion in a case in which a supply amount of a gas supplied from the outer space of the container main body to the substrate storing space through the gas supply filter portion is 22 liters per minute or less, by variously changing the configuration of the gas supply filter portion and the exhaust filter portion in the substrate storing container.

More specifically, for example, it may be configured such that the flow rate performance of the exhaust filter portion is higher than the flow rate performance of the gas supply filter portion. As the flow rate performance, a value of a flow rate performance is used which is measured according to an IPA flow method that measures the time required for 500 mL of IPA to pass through a sample having an exhaust filter film total effective area of 13.8 cm$^2$ under a pressure of 98 kPa using a pressurized filtering device. It is more preferred that the flow rate performance of the exhaust filter portion is five times the flow rate performance of the gas supply filter portion. With such a configuration, it is possible to sufficiently secure the flow rate performance of the exhaust filter portion, and 50% or more of a gas supplied to the substrate storing space can be reliably discharged from the exhaust filter portion in a case in which a supply amount of a gas supplied from the outer space of the container main body to the substrate storing space through the gas supply filter portion is 22 liters per minute or less. As a result, it is possible to collect the purge gas injected into the substrate storing space at an appropriate location, and it is also possible to maintain a safe working environment.

The above-described flow rate performance can be obtained by setting to a predetermined value the flow rate performance of the filter configured by the ventilation films included in each of, for example, the gas supply filter portion and the exhaust filter portion. In other words, more specifically, it is configured such that the flow rate performance of the ventilation film of the exhaust filter portion is higher than the flow rate performance of the ventilation film of the gas supply filter portion.

Furthermore, in a case in which the exhaust filter portion includes a check valve (for example, the check valve member 97) as in the present embodiment, the exhaust filter portion (the ventilation film) may not be provided. In such a case, the exhaust filter portion does not include the ventilation film that configures a filter; however, it is still referred to as "exhaust filter portion" for convenience of description. With such a configuration, the flow rate performance of the exhaust filter portion is configured to be higher than the flow rate performance of the gas supply filter portion. With such a configuration, it is possible to simplify the configuration of the exhaust filter portion.

Furthermore, the exhaust filter portion is larger than the gas supply filter portion in terms of, for example, the filter film total effective area that allows a gas to flow through the filter (the ventilation film), so that 50% or more of a gas supplied to the substrate storing space can be discharged from the exhaust filter portion in a case in which a supply amount of a gas supplied from the outer space of the container main body to the substrate storing space through the gas supply filter portion is 22 liters per minute or less. More specifically, for example, the filter film total effective area of the exhaust filter portion is 200 mm$^2$ to 1,000 mm$^2$, and the filter film total effective area of the gas supply filter portion is 150 mm$^2$ to 750 mm$^2$. With such a configuration, 50% or more of a gas supplied to the substrate storing space can be discharged from the exhaust filter portion in a case in which a supply amount of a gas supplied from the outer space of the container main body to the substrate storing space through the gas supply filter portion is 22 liters per minute or less. This configuration may be combined with the configuration in which the flow rate performance of the filter (the ventilation film) of the exhaust filter portion is configured to be higher than the flow rate performance of the filter (the ventilation film) of the gas supply filter portion, or alternatively, this configuration may be employed alone.

Furthermore, in a case in which the exhaust filter portion and the gas supply filter portion each have the filter (the ventilation film), at least either of the exhaust filter portion or the gas supply filter portion may not include the check valve. More specifically, for example, it may be configured in the present embodiment such that at least either of the gas supply filter portion or the exhaust filter portion does not include the check valve member 97 included in the gas supply filter portion 90 or the exhaust filter portion 90A. With such a configuration, it is possible to simplify the configuration of the exhaust filter portion.

Furthermore, the shapes of the container main body and the lid body and the number and dimensions of substrates W that can be stored in the container main body are not limited to the shape of the container main body 2 and the lid body 3, and the number and dimensions of the substrates W that can be stored in the container main body 2 according to the present embodiments. Furthermore, the substrate W according to the present embodiment is a silicon wafer having a diameter of 300 mm. However, the present invention is not limited to this value.

Furthermore, the back side substrate support portion is configured by the back side substrate support portion 6 in the present embodiment; however, the present invention is not limited to this configuration. For example, the back side substrate support portion may be configured by a rear retainer that is configured to be integrally molded with the container main body.

Furthermore, the two exhaust filter portions 90A are provided at the front portion of the lower wall 24, and the two gas supply filter portions 90 are provided at the rear portion of the lower wall 24; however, the present invention is not limited to this configuration. For example, the two exhaust filter portions 90A may be provided at the rear portion of the lower wall 24, and the two gas supply filter portions 90 may be provided at the front portion of the lower wall 24. Alternatively, the exhaust filter portion and the gas supply filter portion may not necessarily be provided in pairs.

EXPLANATION OF REFERENCE NUMERALS 1 substrate storing container
2 container main body 3 lid body
4 sealing member
20 wall portion
21 container main body opening portion
27 substrate storing space
28 opening circumferential portion
90 gas supply filter portion
90A exhaust filter portion
91 filter housing (filter portion housing)
96 ventilation film (filter)
210 ventilation passage
971 valve body
972 spring
W substrate

The invention claimed is:

1. A container main body including a substrate storing space formed therein which can store a plurality of substrates, and including an opening circumferential portion at one end thereof at which a container main body opening portion in communication with the substrate storing space is formed;
   a lid body that is attachable to and detachable from the opening circumferential portion and can close the container main body opening portion in a positional relationship being surrounded by the opening circumferential portion;
   a sealing member that is attached to the lid body, can abut the lid body and the opening circumferential portion, and intervenes between the opening circumferential portion and the lid body to adhere to and abut the opening circumferential portion, thereby closing the container main body opening portion together with the lid body; and
   a filter portion including a ventilation passage that allows the substrate storing space and an outer space of the container main body to be in communication with each other, a filter disposed in the ventilation passage, and a filter portion housing forming the ventilation passage, wherein the filter portion is disposed at the container main body, and allows a gas to pass between the outer space of the container main body and the substrate storing space through the filter;
   wherein the filter portion includes an exhaust filter portion that allows a gas to flow from the substrate storing space to the outer space of the container main body, and a gas supply filter portion that allows a gas to flow from the outer space of the container main body to the substrate storing space,
   wherein the filter is provided in the ventilation passage for exhaust that allows the gas to flow from the substrate storing space to the outer space of the container main body, and partitions the ventilation passage into an upstream side and a downstream side,
   wherein an exhaust filter film total effective area that allows a gas to flow through the filter is 200 mm² or more, and
   wherein airtightness of the substrate storing space is enhanced so that 50% or more of a gas supplied to the substrate storing space can be discharged from the exhaust filter portion in a case in which a supply amount of a gas supplied from the outer space of the container main body to the substrate storing space through the gas supply filter portion is 22 liters per minute or less.

2. The substrate storing container according to claim 1, wherein the sealing member seals the opening circumferential portion and the lid body so that a positive pressure in a container in the substrate storing space is 0.15 kpa or more when the gas is supplied from the outer space of the container main body to the substrate storing space through the gas supply filter portion.

3. The substrate storing container according to claim 1, wherein the exhaust filter portion includes a valve body and a spring, the valve body switching between communication and blocking of the ventilation passage for exhaust which allows the gas to flow from the substrate storing space to the outer space of the container main body, the spring biasing the valve body in a direction blocking the ventilation passage for exhaust, and
   wherein a spring constant of the spring is 0.05 kgf/mm or less.

4. A substrate storing container comprising:
   a container main body including a substrate storing space formed therein which can store a plurality of substrates, and including an opening circumferential portion at one end thereof at which a container main body opening portion in communication with the substrate storing space is formed;
   a lid body that is attachable to and detachable from the opening circumferential portion and can close the container main body opening portion in a positional relationship being surrounded by the opening circumferential portion;
   a sealing member that is attached to the lid body, can abut the lid body and the opening circumferential portion, and intervenes between the opening circumferential portion and the lid body to adhere to and abut the opening circumferential portion and the lid body, thereby closing the container main body opening portion together with the lid body; and
   a filter portion including a ventilation passage that allows the substrate storing space and an outer space of the container main body to be in communication with each other, a filter disposed in the ventilation passage, and a filter portion housing forming the ventilation passage, wherein the filter portion is disposed at the container main body, and allows a gas to pass between the outer space of the container main body and the substrate storing space through the filter;
   wherein the filter portion includes an exhaust filter portion that allows a gas to flow from the substrate storing space to the outer space of the container main body, and a gas supply filter portion that allows a gas to flow from the outer space of the container main body to the substrate storing space, and
   wherein the filter has a flow rate performance of 15 seconds or less according to an IPA flow method that measures a time required for 500 mL of IPA to pass through a sample having an exhaust filter film total effective area of 13.8 cm² under a pressure of 98 kPa using a pressurized filtering device, so that 50% or more of a gas supplied to the substrate storing space can be discharged from the exhaust filter portion in a case in which a supply amount of a gas supplied from the outer space of the container main body to the substrate storing space through the gas supply filter portion is 22 liters per minute or less.

5. The substrate storing container according to claim 4, wherein the filter is provided in the ventilation passage for exhaust that allows the gas to flow from the substrate storing space to the outer space of the container main body, and partitions the ventilation passage into an upstream side and a downstream side, and wherein an exhaust filter film total effective area that allows a gas to flow through the filter is 200 mm² or more.

6. A substrate storing container comprising:

a container main body including a substrate storing space formed therein which can store a plurality of substrates, and including an opening circumferential portion at one end thereof at which a container main body opening portion in communication with the substrate storing space is formed;

a lid body that is attachable to and detachable from the opening circumferential portion and can close the container main body opening portion in a positional relationship being surrounded by the opening circumferential portion;

a sealing member that is attached to the lid body, can abut the lid body and the opening circumferential portion, and intervenes between the opening circumferential portion and the lid body to adhere to and abut the opening circumferential portion and the lid body, thereby closing the container main body opening portion together with the lid body; and a filter portion including a ventilation passage that allows the substrate storing space and an outer space of the container main body to be in communication with each other, and a filter portion housing forming the ventilation passage, wherein the filter portion is disposed at the container main body, and allows a gas to pass between the outer space of the container main body and the substrate storing space;

wherein the filter portion includes an exhaust filter portion that allows a gas to flow from the substrate storing space to the outer space of the container main body, and a gas supply filter portion that allows a gas to flow from the outer space of the container main body to the substrate storing space, and wherein the exhaust filter portion is higher than the gas supply filter portion in terms of a flow rate performance measured according to an IPA flow method that measures a time required for 500 mL of IPA to pass through a sample having an exhaust filter film total effective area of 13.8 cm² under a pressure of 98 kPa using a pressurized filtering device, so that 50% or more of a gas supplied to the substrate storing space can be discharged from the exhaust filter portion in a case in which a supply amount of a gas supplied from the outer space of the container main body to the substrate storing space through the gas supply filter portion is 22 liters per minute or less.

7. The substrate storing container according to claim 6, wherein the flow rate performance of the exhaust filter portion is five times the flow rate performance of the gas supply filter portion.

8. The substrate storing container according to claim 6, wherein the exhaust filter portion includes a check valve that allows a gas to flow only in a direction from the substrate storing space toward the outer space of the container main body.

9. The substrate storing container according to claim 6, wherein the exhaust filter portion includes a filter disposed in the ventilation passage, wherein the gas supply filter portion includes a filter disposed in the ventilation passage, and wherein a flow rate performance of the filter of the exhaust filter portion is higher than a flow rate performance of the filter of the gas supply filter portion.

10. The substrate storing container according to claim 9, wherein the filter is provided in the ventilation passage for exhaust that allows the gas to flow from the substrate storing space to the outer space of the container main body, and partitions the ventilation passage into an upstream side and a downstream side, and wherein the exhaust filter portion is larger than the gas supply filter portion in terms of the exhaust filter film total effective area that allows a gas to flow through the filter.

11. The substrate storing container according to claim 8, wherein a filter is not provided in the ventilation passage of the exhaust filter portion, and the gas supply filter portion includes a filter disposed in the ventilation passage.

12. The substrate storing container according to claim 6, wherein the gas supply filter portion includes a check valve that allows a gas to flow only in a direction from the outer space of the container main body toward the substrate storing space.

* * * * *